(12) United States Patent
Horng

(10) Patent No.: US 7,208,675 B2
(45) Date of Patent: Apr. 24, 2007

(54) SHIELDING COVER

(76) Inventor: Chin-Hsing Horng, No. 2, Alley 8, Lane 2, Min-Sheng N. Rd. Sec. 1, Kuei-Shan Town, Taoyuan County (TW)

( * ) Notice: Subject to any disclaimer, the term of this patent is extended or adjusted under 35 U.S.C. 154(b) by 0 days.

(21) Appl. No.: 11/395,840

(22) Filed: Mar. 30, 2006

(65) Prior Publication Data

US 2006/0292906 A1 Dec. 28, 2006

(51) Int. Cl.
*H05K 9/00* (2006.01)

(52) U.S. Cl. .................... 174/35 R; 361/816; 439/607; 439/135

(58) Field of Classification Search ............... 439/135, 439/607; 174/372, 384, 35 R, 35 GC; 361/816, 361/818, 800
See application file for complete search history.

(56) References Cited

U.S. PATENT DOCUMENTS

| 4,641,906 | A | * | 2/1987 | Olsson .................... 439/465 |
| 5,614,694 | A | * | 3/1997 | Gorenz et al. .............. 174/375 |
| 6,081,431 | A | * | 6/2000 | Lemke ................... 361/800 |
| 6,178,097 | B1 | * | 1/2001 | Hauk, Jr. .................. 361/816 |
| 6,831,224 | B2 | * | 12/2004 | Koivusilta ................. 174/375 |
| 6,897,371 | B1 | * | 5/2005 | Kurz et al. ................. 174/382 |
| 6,903,262 | B2 | * | 6/2005 | Blersch .................... 174/385 |
| 7,075,798 | B2 | * | 7/2006 | Hendrickson ............... 361/818 |
| 2002/0139552 | A1 | * | 10/2002 | Chang ..................... 174/35 R |
| 2006/0121784 | A1 | * | 6/2006 | Lee ........................ 439/607 |

* cited by examiner

*Primary Examiner*—Michael C. Zarroli

(57) ABSTRACT

A shielding cover includes a cover plate, a base integrally coupled with the cover plate, and a score without cutting off the cover plate. The base is formed by enclosing an iron frame, and at least a pair of soldering pins are built at a lower edge of the frame of the base, and the base body in the middle of the base acts as the cover plate and integrally coupled with the frame of the base.

2 Claims, 4 Drawing Sheets

SHIELDING COVER

BACKGROUND OF THE INVENTION

1. Field of the Invention

The present invention relates to a shielding cover, and more specifically to a shielding cover that simply uses a set of integrated mold, a metal sheet, and a consistent manufacturing process to produce the shielding cover whose cover can be detached easily for facilitating maintenance and repair.

2. Description of the Related Art

Referring to FIGS. 8 and 9 for the conventional shielding cover 2 of a mobile phone or similar appliance, the shielding cover 2 comprises a base 21 and a lid 22 integrally coupled with each other.

Since the shielding cover 2 is installed on a mobile phone or similar appliance, the shielding cover 2 shields a portion of electronic or computer components and accessories. If the electronic or computer components fail to operate or are damaged, it is necessary to lift up the lid 22 of the shielding cover 2 to repair or change new components or accessories. After the components or accessories are replaced or repaired, it is necessary to close the lid 22 of the shielding cover 2 to maintain the original functions and effects of the mobile phone or similar appliance. Thus, general mobile phone or similar appliance manufacturers will manufacture a shielding cover 2 by separately producing a base 21 and a lid 22 as shown in FIG. 9. The base 21 includes a seat 210 formed by enclosing an iron frame 211, and each external side of the iron frame 211 of the seat 210 has at least one protruded point 212. The lid 22 includes a cover 220 having each side of its periphery perpendicular to a plate 221, and each perpendicular flange 222 at the periphery of the cover 220 has at least one aperture 223 corresponding to the size and position of the protruded point 212 of the frame 211 at each side of the seat 210 of the base 21. When the lid 22 is covered onto the base 21, the plurality of protruded points 212 disposed on the seat 210 are fixed and embedded integrally into the base 21, so that the lid 22 will not be loosened or fallen out. If the lower edge of the frame 211 of the seat 210 has at least one pair of soldering pins 213 soldered on a base board (not shown in the figure) of a mobile phone or similar appliance during its installation and use, and the electronic or computer components or accessories shielded by the shielding cover 2 fail or are damaged, we simply need a screwdriver to pry the perpendicular flange 222 at the periphery of the lid cover 220 of the shielding cover 2, so that the aperture 223 of the flange 222 is separated from the protruded point 212 disposed on the external side of the frame 211 of the seat 210 of the base seat 21, and then the cover 220 is lifted open to quickly detach the lid 22 from the base 21, so as to facilitate the maintenance and repair of the electronic or computer components or accessories shielded by the shielding cover 2. After the maintenance and repair is completed, the originally pried and deformed perpendicular flange 222 of the lid cover 220 is returned slightly inward to resume its original position, so as to cover onto the seat 210 soldered onto the base of the baseboard. Meanwhile, the protruded points 212 on the external side of each frame 211 of the seat 210 resume their positions to latch the corresponding apertures 223 on each flange 222 of the cover 220, so that the lid 22 and the base 21 can be integrally coupled as a new shielding cover, and the lid 22 and the base 21 will not be loosened or fallen out.

The way of installing the foregoing prior art shielding cover 2 onto a mobile phone or similar appliance for use or maintenance works fine, but the present technologies advance and manufacturers emphasize on the quality of their products and a low failure rate, and thus a vast majority of mobile phone or similar appliance manufacturers consider that the manufacturing of a shielding cover 2 by separately producing the lid 22 and the base 21 first and then assembling the two components will increase the material cost of the lid 22 and double the manufacturing cost for the production and assembling process, and such prior art shielding cover definitely requires improvements.

SUMMARY OF THE INVENTION

Therefore, it is a primary objective of the present invention to provide a shielding cover.

To achieve the foregoing objective, the present invention provides a shielding cover comprising: a cover plate and a base integrally coupled, and a score without cutting through the cover plate and disposed between the cover plate and the base.

The base of the shielding cover of the invention is formed by enclosing an iron frame, and at least a pair of soldering pins disposed at a lower edge of the frame, and a base body at the middle of the base serves as the cover plate integrally coupled with the frame of the base.

The shielding cover of the invention further comprises at least one position having no score and disposed on an external edge of the cover plate, and an indent disposed on another external edge of the cover plate for prying.

The shielding cover of the invention further comprises a rectangular window hole disposed on an internal side of the cover plate adjacent to the indent for prying, and a sheet plate disposed in the window hole and bent downward first and attached onto a lower surface of the cover plate, and its distal end is extended out from the external side of the cover plate adjacent to the indent to form a protruded plate.

The shielding cover of the invention further comprises a score disposed between the cover plate and the base and installed on either an upper surface or a lower surface of the cover plate, or installed both on an upper surface and a lower surface of the cover plate.

The shielding cover further comprises a protruded point disposed on the protruded plate, and an aperture disposed on a horizontal wall of the frame of the base corresponding to the protruded point.

The present invention can simplify the maintenance and repair and lower manufacturing costs.

DETAILED DESCRIPTION OF THE PREFERRED EMBODIMENTS

Figure 1:
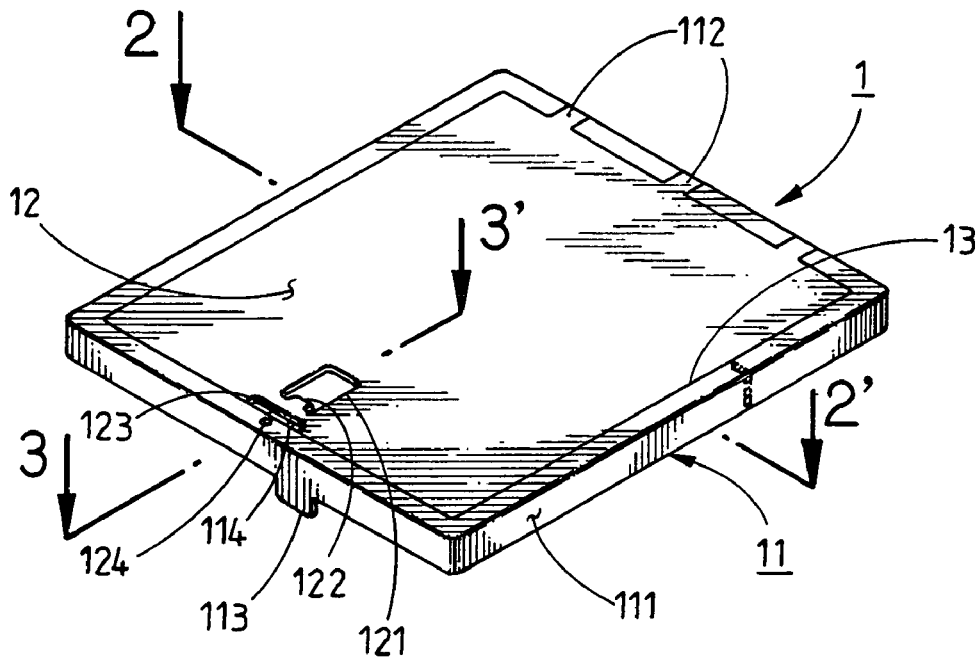
FIG. 1 is a perspective view of finished goods of a shielding cover of the present invention.

Referring to FIG. 1 for the perspective view of a finished goods of a shielding cover 1 in accordance with the present invention, the shielding cover 1 simply needs a set of "continuous" mold, a metal sheet, and a "consistent" stamping process to directly produce from a cover plate 12 and a base 11 into an integrally coupled shielding cover body by the stamping process, and then a score 13 without cutting the cover plate 12 is stamped between the cover plate 12 and the base 11, so as to produce a shielding cover 1 to be installed to a general mobile phone or similar appliance.

Figure 7:
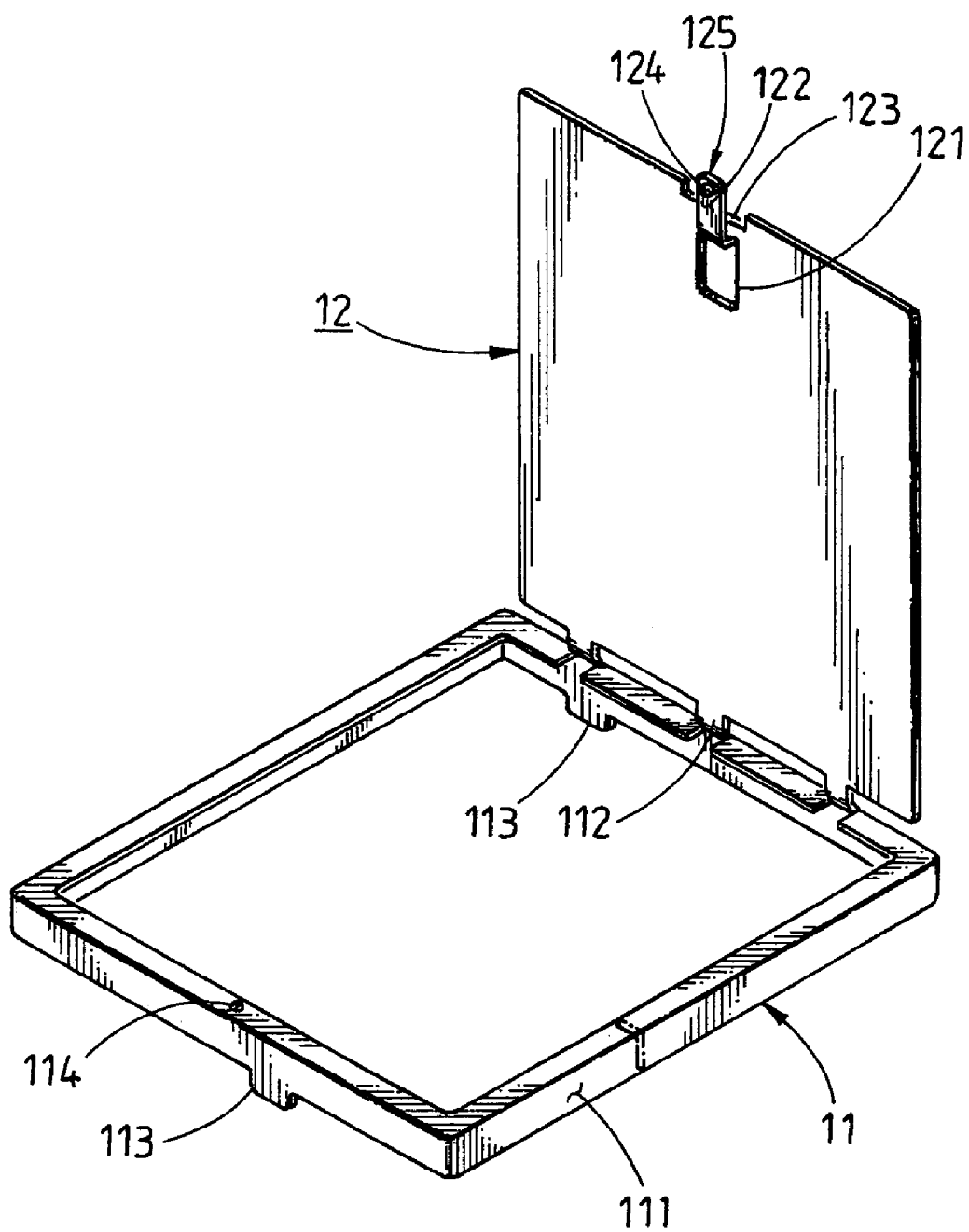
FIG. 7 is a perspective view of a shielding cover whose cover plate is being pried, torn and lifted open for maintenance and repair.
Figure 8:
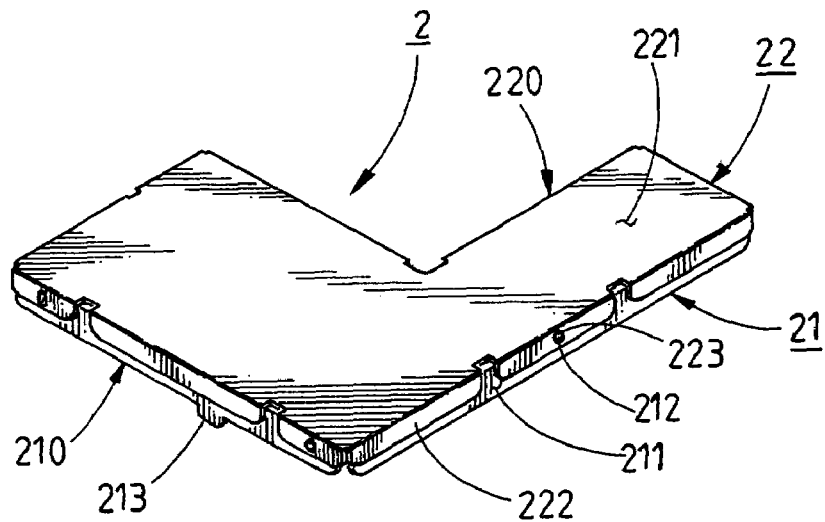
FIG. 8 is a perspective view of a prior art shielding cover.
Figure 9:
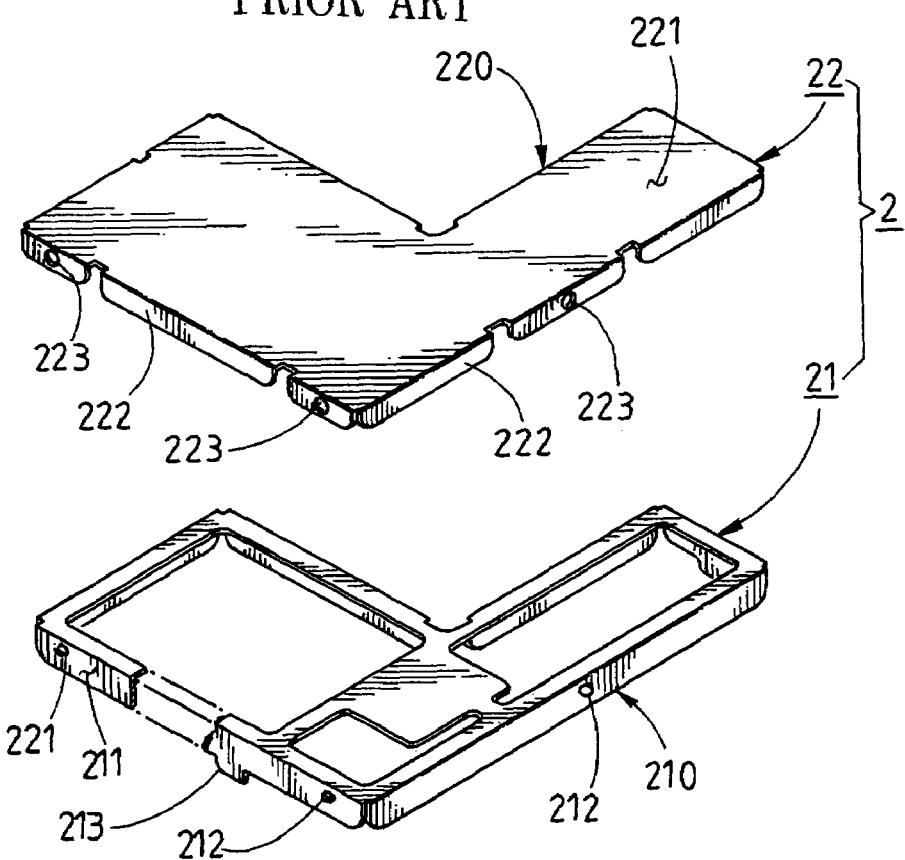
FIG. 9 is an exploded view of a prior art shielding cover.

Referring to FIG. 7 for the base 11 of the shielding cover 1 of the present invention, the base 11 is formed by enclosing an iron frame 111, and at least one pair of soldering pins 113 are disposed at the lower edge of the frame 111. The basic structure and characteristics are similar to the seat 210 of the base 21 of a prior art shielding cover 2. However, when the base 11 is shaped as shown in FIG. 4, the material remained from shaping the cover plate can be used for making the foregoing cover plate 12 which is integrally coupled to the frame 111 of the base 11, so as to form a flat inverted U-shape cover 110' with a transversal cross-section and a longitudinal cross-section as shown in FIG. 5, and thus manufacturers can use the waste material.

Figure 2:
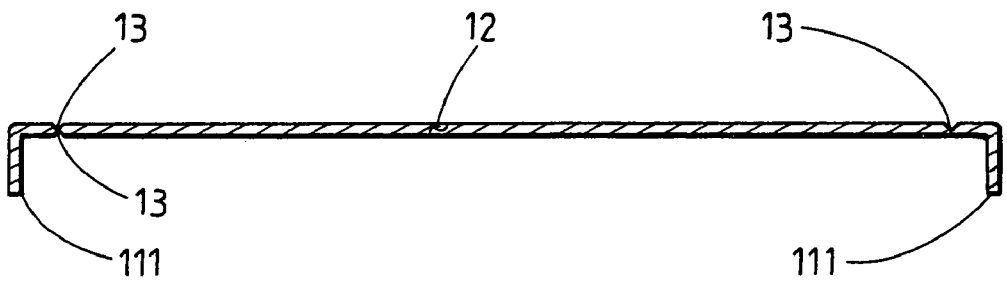
FIG. 2 is an enlarged cross-sectional view of Section 2–2' as depicted in FIG. 1.
Figure 4:
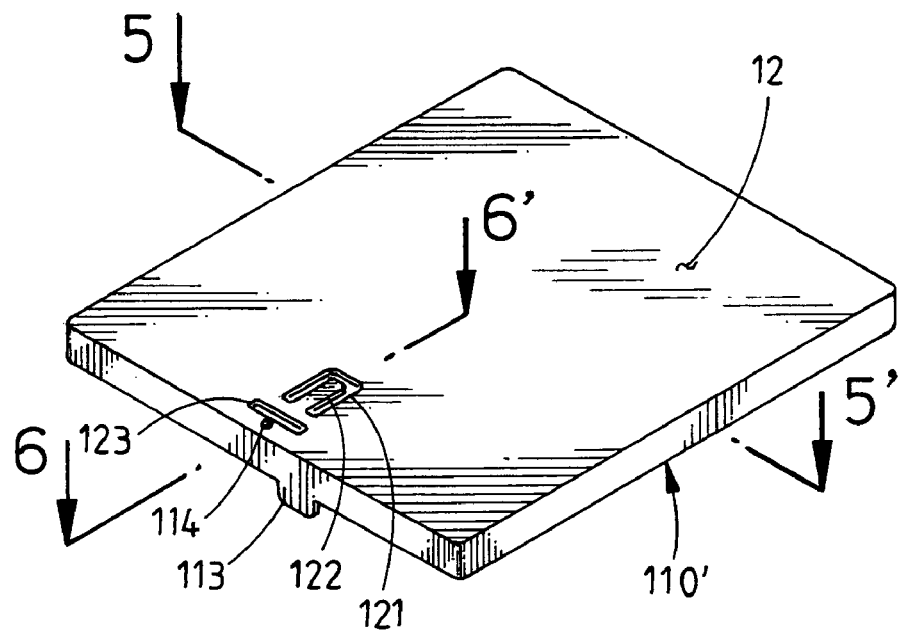
FIG. 4 is a perspective view of semi-finished goods of a shielding cover of the present invention.
Figure 5:
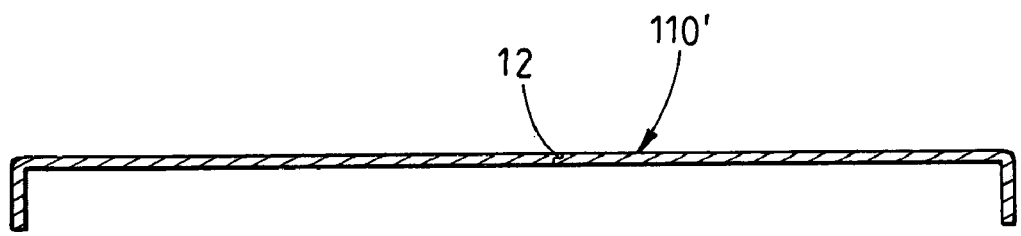
FIG. 5 is an enlarged cross-sectional view of Section 5–5' as depicted in FIG. 4.
Figure 6:
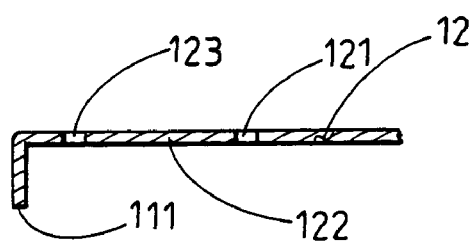
FIG. 6 is an enlarged cross-sectional view of Section 6–6' as depicted in FIG. 4.

After the middle of the base 11 is formed, the cover plate 12 is integrated with the frame 111 of the base 11 as shown in FIGS. 4 and 5, but it is necessary to create a score 13 similar to the pulling tab of a soft drink and without cutting through the cover plate 12, and the score 13 is disposed between the frame 111 of the base 11 and the cover plate 12 as shown in FIG. 1. The shape and structure of the score 13 are shown in FIG. 2, and only one score 13 is made on the upper side or the lower side of the cover plate 12, or installed both on the upper side and the lower side of the cover plate 12. At least one position 112 having no score is disposed on an external edge of the cover plate 12, so that the cover plate 12 has at least one position integrally coupled with the frame 111 of the base 11, and it is necessary to build an indent 123 on another external edge of the cover plate 12 for prying.

Figure 3:
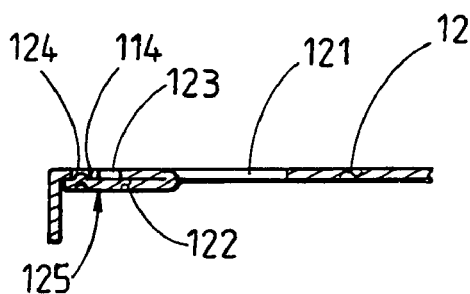
FIG. 3 is an enlarged cross-sectional view of Section 3–3' as depicted in FIG. 1.

Further, the cover plate 12 of the shielding cover 1 in accordance with the present invention is stamped at the internal side thereof and adjacent to the indent 123, to form a rectangular window hole 121 in the beginning of the shaping process as shown in FIG. 4, and a sheet plate 122 is disposed in the window hole 121. After the sheet plate 122 is bent downward, the sheet plate 122 is attached onto the lower surface of the cover plate 12 as shown in FIGS. 1 and 3 and protruded from an external edge adjacent to the indent 123 to form a "protruded plate 125" for latching the lower surface of a horizontal wall of the iron frame 111 of the base 11. Meanwhile, the protruded plate 125 of the plate 122 of the cover plate 12 can latch onto the lower surface of the horizontal wall of the iron frame 111 of the base 11, and a protruded point 124 (as shown in FIG. 3) is disposed on the protruded plate, and an aperture 114 is disposed on the horizontal wall at a position corresponding to the frame 111.

The shielding cover 1 also includes at least one pair of soldering pins 113 disposed at the lower edge of the frame 111 of the base 11 and soldered to a baseboard (not shown in the figure) of a mobile phone or similar appliance. If it is necessary to maintain or repair the electronic or computer components or accessories shielded by the shielding cover 1, a screwdriver is needed to insert into the indent 123 disposed on the external edge of the cover plate 12 to pry the cover plate 12 from the base and tear down and lift up to the status as shown in FIG. 7, so as to maintain or repair the shielded electronic or computer components or accessories. After the maintenance and repair is done, the frame 111 of the base 11 is covered back onto the cover plate 12, and the protruded plate 125 disposed at the external edge of the indent 123 of the cover plate 12 is inserted into the horizontal wall of the frame 111 of the base 11, such that the protruded point 124 will be latched into the aperture 114 of the frame 111 as shown in FIG. 3 to resume the original position as shown in FIG. 1.

What is claimed is:

1. A shielding cover comprising: a cover plate, a base, the cover plate and the base being integrally coupled, a score without cutting through the cover plate disposed between the cover plate and the base, the base defining a base body formed by an iron frame and including at least one pair of soldering pins disposed at a lower edge of the frame, an indent disposed on another external edge of the cover plate for prying, wherein the shielding cover further containing:
    at least one position having no score, disposed at an external edge of the cover plate on an opposite side of the indent;
    a rectangular window hole near the internal side of the indent on the cover plate; and
    a sheet plate installed in the window hole, first bent downward and attached onto a lower surface of the cover plate, a distal end of the sheet plate being extended out from the cover plate adjacent to the indent to form a protruded point.

2. The shielding cover of claim 1, wherein the protruded plate on the sheet plate of the cover plate includes a protruded point, and the iron frame of the base having an aperture disposed on a horizontal wall thereof.

* * * * *